(12) United States Patent
Chen et al.

(10) Patent No.: US 7,232,730 B2
(45) Date of Patent: Jun. 19, 2007

(54) METHOD OF FORMING A LOCALLY STRAINED TRANSISTOR

(75) Inventors: Chien-Hao Chen, Chuangwei Township (TW); Donald Y. Chao, Shin-Chu (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/119,522

(22) Filed: Apr. 29, 2005

(65) Prior Publication Data

US 2006/0246672 A1    Nov. 2, 2006

(51) Int. Cl.
*H01L 21/336*     (2006.01)
(52) U.S. Cl. .................. 438/301; 257/E21.435
(58) Field of Classification Search ......... 438/301, 438/353, 218
See application file for complete search history.

(56) References Cited

U.S. PATENT DOCUMENTS

| | | | |
|---|---|---|---|
| 6,573,172 B1 * | 6/2003 | En et al. .............. | 438/626 |
| 6,703,282 B1 | 3/2004 | Yang et al. | |
| 6,825,529 B2 | 11/2004 | Chidambarrao et al. | |
| 6,902,971 B2 * | 6/2005 | Grudowski .......... | 438/218 |
| 2004/0104405 A1 | 6/2004 | Huang et al. | |
| 2004/0113217 A1 | 6/2004 | Chidambarrao et al. | |
| 2004/0200417 A1 | 10/2004 | Hanawa et al. | |
| 2004/0212035 A1 | 10/2004 | Yeo et al. | |
| 2004/0262784 A1 | 12/2004 | Doris et al. | |
| 2005/0020022 A1 | 1/2005 | Grudowski | |
| 2006/0099765 A1 * | 5/2006 | Yang .................. | 438/301 |

OTHER PUBLICATIONS

GE, C.-H., et al., "Process-Strained Si (PSS) CMOS Technology Featuring 3D Strain Engineering," IEEE (2003) 4 pages.
Ghani, T., et al., "A 90nm High Volume Manufacturing Logic Technology Featuring Novel 45nm Gate Length Strained Silicon CMOS Transistors," IEDM (2003) pp. 978-980.
Ito, S., et al., "Mechanical Stress Effect of Etch-Stop Nitride and Its Impact on Deep Submicron Transistor Design," IEDM (2000) pp. 247-250.

(Continued)

*Primary Examiner*—Scott B. Geyer
*Assistant Examiner*—Elias Ullah
(74) *Attorney, Agent, or Firm*—Slater & Matsil, L.L.P.

(57) ABSTRACT

A preferred embodiment of the invention provides a semiconductor fabrication method. An embodiment comprises forming a MOS device having sidewall spacers. A highly stressed layer is deposited over the device. The stress is selectively adjusted in that portion of the layer over the gate electrode and the sidewall spacers. Preferably, the stress layer over the gate electrode and over the sidewall spacers is adjusted from a first stress to a second stress, wherein the first stress is one of tensile and compressive, and the second stress is the other of tensile and compressive. Preferred embodiments selectively induce a suitable stress within PMOS and NMOS channel regions for improving their respective carrier mobility. Still other embodiments of the invention comprise a field effect transistor (FET) having a overlying stressed layer, the stressed layer being comprised of different stress regions.

14 Claims, 5 Drawing Sheets

OTHER PUBLICATIONS

Nowling, G.R., et al., "Remote Plasma-Enhanced Chemical Vapour Deposition of Silicon Nitride at Atmospheric Pressure," Plasma Sources Sci. Technol., vol. 11 (2002) pp. 97-103.

Ootsuka, F., et al., "A Highly Dense, High-Performance 130nm Node CMOS Technology for Large Scale System-on-a-Chip Applications." IEDM (2000) pp. 575-578.

Scott, G., et al., "NMOS Drive Current Reduction Caused by Transistor Layout and Trench Isolation Induced Stress," IEDM (1999) pp. 827-830.

Shimizu, A., et al., "Local Mechanical-Stress Control (LMC): A New Technique for CMOS-Performance Enhancement," IEDM (2001) pp. 433-436.

Xiang, Y., et al., "Measuring the Elastic Modulus and Ultimate Strength of Low-K Dielectric Materials by Means of the Bulge Test," IEEE (2004) pp. 133-135.

Zhang, X., et al., "Residual Stress Characterization of Thick PECVD TEOS Film for Power MEMs Applications," Solid-State Sensor and Actuator Workshop, (Jun. 2000) pp. 1-4.

* cited by examiner

METHOD OF FORMING A LOCALLY STRAINED TRANSISTOR

TECHNICAL FIELD

This invention relates generally to semiconductors, and more specifically to MOSFET devices having stress enhanced carrier mobility.

BACKGROUND

Size reduction of metal-oxide-semiconductor field-effect transistors (MOSFETs) has enabled the continued improvement in speed performance, density, and cost per unit function of integrated circuits. One way to improve transistor performance is through selective application of stress to the transistor channel region. Stress distorts (i.e., strains) the semiconductor crystal lattice, and the distortion in turn affects the band alignment and charge transport properties of the semiconductor. By controlling the magnitude and distribution of stress in a finished device, manufacturers can increase carrier mobility and improve device performance. There are several existing approaches for applying stress to the transistor channel region.

One conventional approach includes forming an epitaxial, strained silicon layer on a relaxed silicon germanium (SiGe) layer. Since SiGe has a larger lattice constant than Si, the epitaxial Si grown on SiGe will have its lattice stretched in the lateral direction, i.e., it will be under biaxial tensile stress. In this approach, the relaxed SiGe buffer layer is referred to as a stressor that introduces stress in the channel region. The stressor, in this case, is placed below the transistor channel region.

In another approach, stress in the channel region is introduced after the transistor is formed. In this approach, a high-stress film is formed over a completed transistor. The high-stress film distorts the silicon lattice thereby straining the channel region. In this case, the stressor, i.e., the film, is placed above the completed transistor structure.

One problem facing CMOS manufacturing is that NMOS and PMOS devices require different types of stress in order to achieve increased carrier mobility. For example, a biaxial, tensile stress increases NMOS performance approximately twofold. However, for a PMOS device, such a stress yields almost no improvement. With a PMOS device, a tensile stress improves performance when it's perpendicular to the channel, but it has nearly the opposite effect when it is parallel to the channel. Therefore, when a biaxial, tensile film is applied to a PMOS device, the two stress effects almost cancel each other out.

Workers in the art are aware of these problems. Therefore, new CMOS manufacturing techniques selectively address PMOS and NMOS devices. An NMOS fabrication method includes using tensile films to improve carrier mobility. A PMOS fabrication method includes using substrate structures that apply a compression stress to the channel. One PMOS method includes selective application of a SiGe layer into the source/drain regions. Another method uses modified shallow trench isolation (STI) structures that compress the PMOS channel.

The use of additional materials, however, adds further processing steps and complexity to the manufacturing process. Therefore, there remains a need for improving the carrier mobility of both NMOS and PMOS devices without significantly adding to the cost or complexity of the manufacturing process.

SUMMARY OF THE INVENTION

These and other problems are generally solved or circumvented, and technical advantages are generally achieved by preferred embodiments of the present invention that provide a device having improved carrier mobility and its method of manufacture.

A preferred embodiment of the invention provides a semiconductor fabrication method. An embodiment comprises forming a MOS device in a substrate, the MOS device comprising a source and a drain (a source/drain), a channel between the source and the drain, and a gate electrode over the channel. Embodiments further comprise forming a stress layer over the MOS device, and selectively adjusting a stress property of the stress layer over the gate electrode and/or the source/drain. Embodiments may comprise selectively adjusting a stress property of the stress layer over one of the gate electrode and the source/drain, while not doing so over the other.

In alternate embodiments, the substrate comprises a material selected from the group consisting essentially of silicon, silicon germanium, or combinations thereof. The stress layer may comprise a material selected from the group consisting essentially of a silicon-rich nitride, nitrided silicon oxide (SiON), silicon nitride (SiN, $SiN_x$), and combinations thereof.

Preferably, the second stress is less than about half the first stress. In other embodiments the magnitude of the difference between the first stress and second stress is at least 500 MPa. In still other embodiments, the first stress is tensile and the second stress is compressive, while in others the first stress is compressive and the second stress is tensile. In preferred embodiments, adjusting a stress property comprises implanting germanium, silicon, argon, xenon, and combinations thereof.

Still another preferred embodiment of the invention comprises forming a gate electrode having a pair of sidewall spacers over a substrate and forming a stress layer over the gate electrode, the sidewall spacers, and the substrate. Embodiments further comprise adjusting a stress property of the stress layer over the gate electrode and over the sidewall spacers from a first stress to a second stress, wherein the first stress is one of tensile and compressive, and the second stress is the other of tensile and compressive.

Still other embodiments of the invention include a semiconductor device. These embodiments comprise a field effect transistor (FET) formed in a substrate. The FET comprises a source region, a drain region, a channel region between the source region and the drain region, and a gate electrode over the channel region. Embodiments further comprise a first stress layer over the source region and the drain region, and a pair of spacers along opposite sidewalls of the gate electrode and within a recess in the first stress layer. Embodiments may also comprise a second stress layer over the gate electrode and over a portion of the pair of spacers outside the recess in the first stress layer, wherein the first stress layer and the second stress layer create a combined stress in the substrate, the combined stress being substantially aligned with the channel. In alternate embodiments, the first stress layer is tensile and the second stress layer is compressive. In other alternate embodiments, the first stress layer is compressive and the second stress layer is tensile.

Note that although the term layer is used throughout the specification and in the claims, the resulting features formed using the layer should not be interpreted together as only a continuous or uninterrupted feature. As will be clear from reading the specification, the semiconductor layer may be separated into distinct and isolated features (e.g., active regions), some or all of which comprise portions of the semiconductor layer. In other embodiments, a layer may refer to a continuous feature having a uniform appearance; yet, it may include regions having different physical or chemical properties.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediated stages of manufacturing a preferred embodiment of the present invention are illustrated throughout the various views and illustrative embodiments of the present invention. To more clearly illustrate certain embodiments, a letter indicating variations of the same structure, material, or process step may follow a figure number.

This invention relates generally to semiconductor device fabrication and more particularly to structures and methods for strained transistors. The present invention will now be described with respect to preferred embodiments in a specific context, namely the creation of a MOSFET device. It is believed that embodiments of this invention are particularly advantageous when used in this process. It is believed that embodiments described herein will benefit other applications not specifically mentioned. Therefore, the specific embodiments discussed are merely illustrative of specific ways to make and use the invention, and do not limit the scope of the invention.

Figure 1:
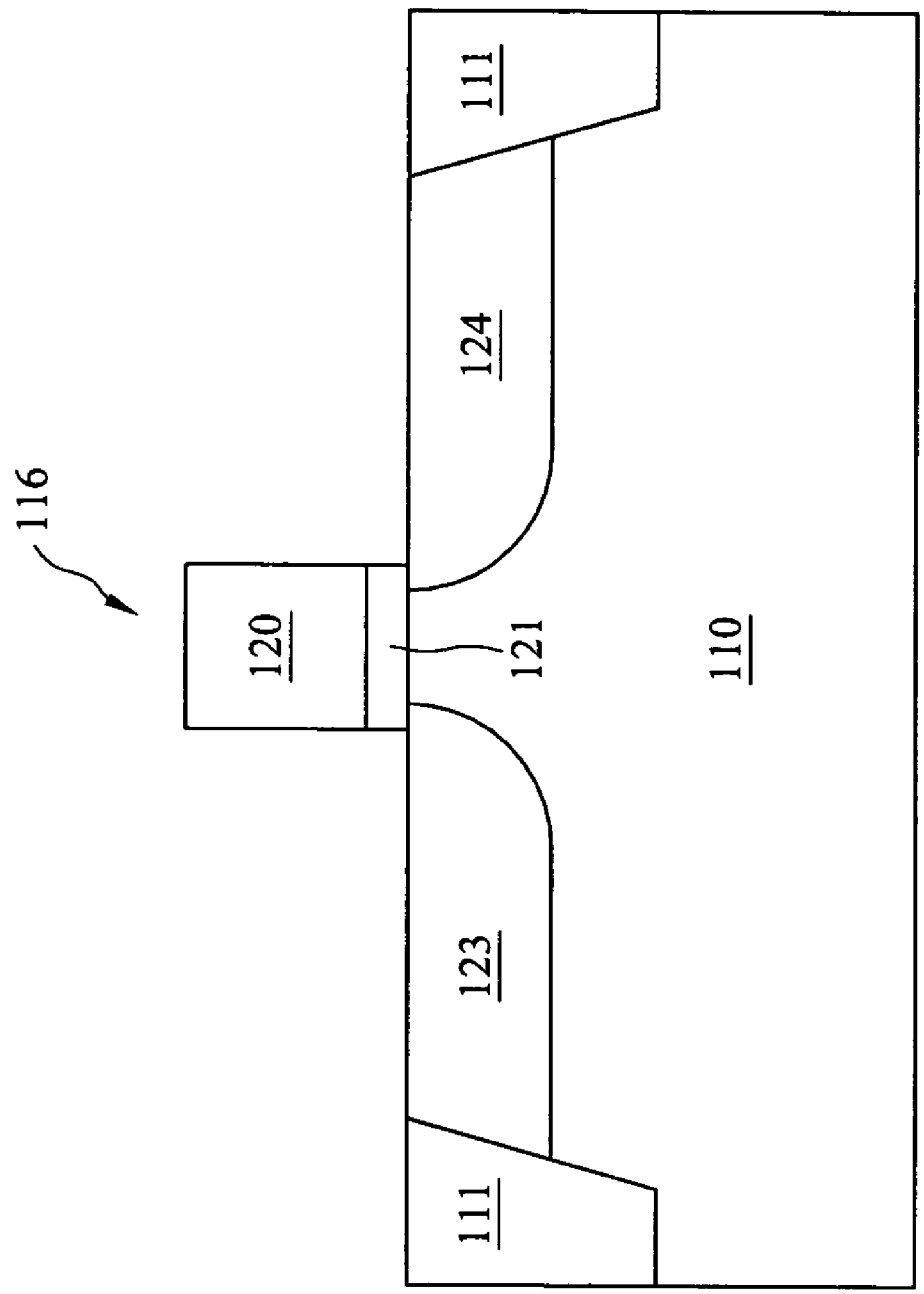
FIG. 1 is a cross-sectional view of an intermediate stage in the manufacture of a MOS device according to embodiments of the invention.

FIG. 1 illustrates a MOS device 116 in an embodiment of the invention. The MOS device 116 includes a substrate 110 that preferably includes at least one NMOS or PMOS region. The substrate 110 is preferably a silicon substrate or a germanium substrate, or a combination thereof. The substrate 110 may further include hybrid orientation substrates fabricated with silicon on insulator (SOI) technology. An isolation device 111 may be formed within the substrate 110 between adjacent NMOS/PMOS devices. The operation voltage for MOS transistor devices is preferably from about 0.6 to 3.3 volts (V) and is more preferably less than about 1.2 V.

In alternative embodiments (not illustrated), STI structures may be optimized to selectively induce stress in n-channel and p-channel transistors separately. For example, a first isolation trench includes a first liner, and a second isolation trench includes a second liner, or none at all. By way of example, a liner may be a nitride layer. The second trench may be lined with a nitride layer that has been modified, e.g., implanted with ions or removed. In another example, the first material can be an oxynitride (a nitrided oxide). In this case, the second trench may be lined with an oxide liner or no liner at all, as examples. A liner can then be modified in some but not all of the plurality of trenches.

Continuing with FIG. 1, MOS device 116 includes a source 123 and a drain 124 region. The source/drain regions are implanted using methods known in the art. Each MOS device further includes a gate electrode 120 and a gate dielectric 121. Underlying the gate electrode 120 and the gate dielectric 121 is a charge carrier channel (not illustrated) connecting the source 123 and drain 124 regions. Because a conventional source/drain implant uses the gate electrode 120 and gate electrode spacers as an implant mask, the source/drain implant may be performed after forming the electrode spacers as described below according to embodiments of the invention.

In alternative embodiments, the channel/substrate orientation may be selected with a view towards optimizing the appropriate charge carrier mobility using SOI hybrid orientation substrates. For example, a NMOS channel may be oriented along the <100> direction, which is the direction of maximum electron mobility for a {100} substrate. Alternatively, a PMOS channel may be oriented along the <110> direction, which is the direction where hole mobility is maximum for a {110} substrate. The respective device channel has a design width from about 0.05 to 10.0 µm, and preferably less than about 0.5 µm.

Gate dielectric 121 may include silicon oxide having a thickness from about 6 to 100 Å, and more preferably less than about 20 Å. In other embodiments, the gate dielectric 121 may include a high-k dielectric having a k-value substantially greater than about 7. Possible high-k dielectrics include $Ta_2O_5$, $TiO_2$, $Al_2O_3$, $ZrO_2$, $HfO_2$, $Y_2O_3$, $L_2O_3$, and their aluminates and silicates. Other suitable high-k gate dielectrics may include hafnium-based materials such as $HfO_2$, $HfSiO_x$, $HfAlO_x$.

Figure 2:
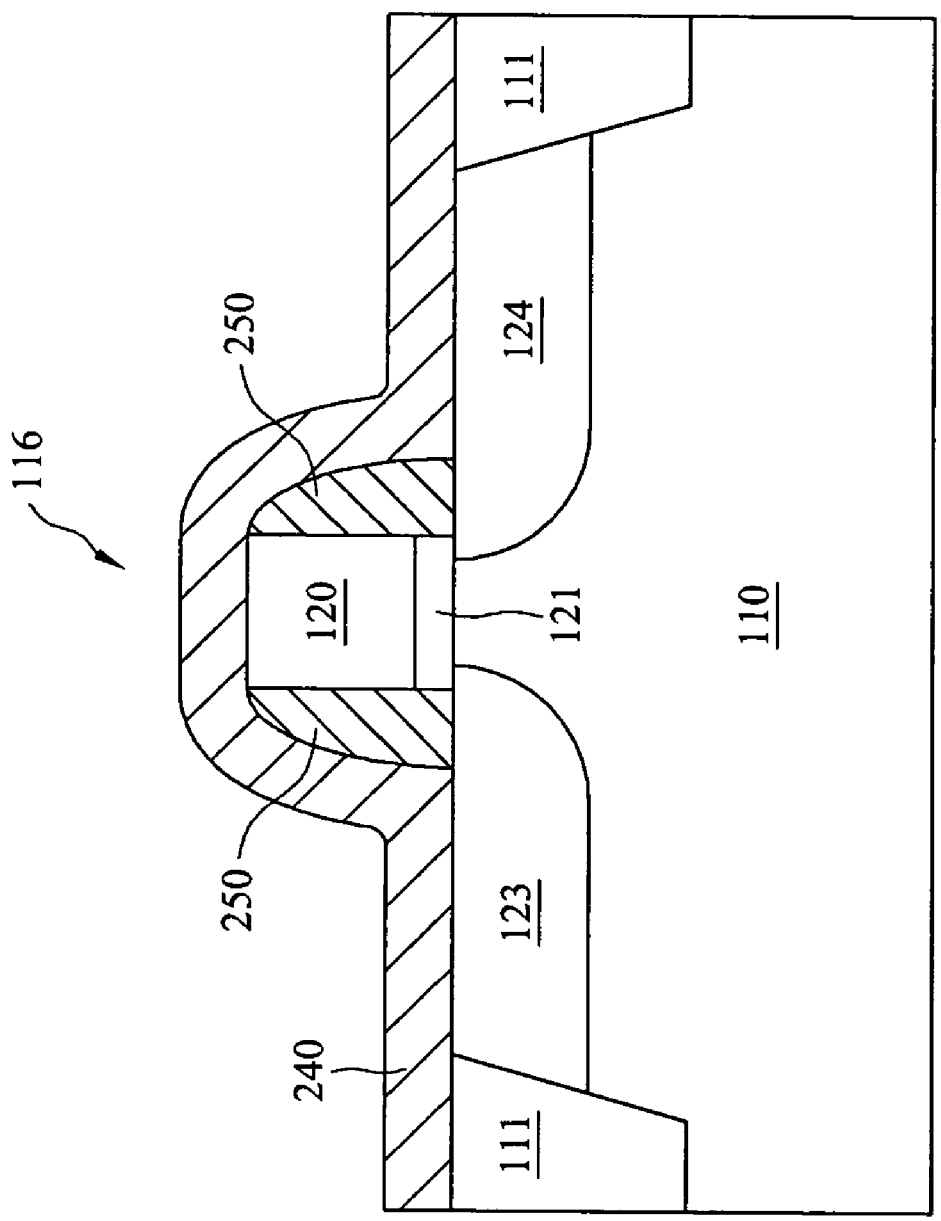
FIG. 2 is a cross-sectional view illustrating a stress layer over an intermediate MOS device according to embodiments of the invention.

Turning now to FIG. 2, there is illustrated the structure of FIG. 1 after further processing according to an embodiment of the invention. In one embodiment, a conventional spacer dielectric layer, such as a thermal silicon oxide, is etched to form sidewall spacers 250 on opposite sides of the gate dielectric 121 and gate electrode 120. In another embodiment, the spacer dielectric film comprises a CVD silicon nitride film formed according to embodiments described below with respect to an RTCVD or a PECVD silicon nitride layer. Anisotropically etching the spacer dielectric layer from the horizontal surfaces leaves the sidewall spacers 250.

A stress layer 240 is formed over the MOS device 116. Stress layer 240 is preferably about 200 to 1000 Å thick. The stress layer 240 preferably comprises a compressive stress layer, although in other embodiments it comprises a tensile stress layer. A process used to form the stress layer may include plasma enhanced chemical vapor deposition (PECVD), low pressure chemical vapor deposition (LPCVD), atomic layer deposition (ALD), rapid thermal chemical vapor deposition (RTCVD), physical vapor deposition (PVD), individually or in combination.

In an embodiment, the stress layer 240 comprises a contact etch stop layer, such as silicon nitride. Stoichiometric silicon nitride films are known to be highly tensile stressed on silicon. However, the tensile stress may be greatly lowered and even turned into compressive stress by adjusting the Si/N ratio. Generally, adding more silicon makes the silicon nitride film more compressive, while adding more nitrogen makes it more tensile. For example, the intrinsic stress of silicon nitride on silicon is preferably adjusted from about 300 to 1700 MPa by adjusting the Si/N ratio.

The compressive stress layer 240 is preferably comprised of silicon nitride ($Si_3N_4$ or $SiN_x$), silicon oxynitride (SiON), oxide, a Si-rich nitride, or a N-rich nitride. The compressive stress layer 240 is more preferably SiN or SiON and is most preferably SiON. It has a thickness from about 200 to 1000 Å, and preferably from about 250 to 500 Å. The compressive stress layer 240 is preferably deposited by plasma enhanced chemical vapor deposition (PECVD). PECVD conditions include a temperature about 300 to 600° C. Deposition time is about 10 to 500 seconds and preferably from about 20 to 120 seconds. The reactant $NH_3$:$SiH_4$ gas ratio is about 4:1 to 10:1, and preferably less than about 8:1. Alternative reactants include a di-saline:$NH_3$ gas ratio from about 1:4 to 1:10, and preferably less than about 1:1. The deposition pressure is preferably about 1.0 to 1.5 Torr. The PECVD power used to form the compressive stress layer 240 is preferably from about 1000 to 2000 watts (W) and more preferably greater than about 1000 W.

In alternative embodiments, the stress layer 240 is a tensile stress layer 240. When the stress layer 240 is a tensile stress layer, suitable materials include, silicon nitride, tetra-ethyl-orthosilicate (TEOS), silicon oxynitride (SiON), oxide, Si-rich nitride, or a N-rich nitride, and it is preferably SiN or SiON. The tensile stress layer 240 has a thickness from about 200 to 1000 Å, and preferably from about 250 to 500 Å. The tensile stress layer 240 is preferably deposited by rapid thermal chemical vapor deposition (RTCVD). The RTCVD temperature is 350 to 800° C., and preferably from about 400 to 700° C. Reaction time is about 10 to 2000 seconds, and preferably about 20 to 120 seconds. The NH3:SiH4 gas ratio is about 50:1 to 400:1, and preferably less than about 700:1. An alternative reactant composition includes a di-saline:NH3 gas ratio about 1:40 to 1:500, and preferably less than about 1:1. The deposition pressure is preferably about 10 to 400 Torr, preferably less than about 300 Torr.

As is known in the art, the stress layer 240 such as that illustrated in FIG. 2 is known to induce a stress in the channel between the source/drain regions of a MOS device. For example, a highly tensile stress/strain film is known to induce a compressive channel stress/strain. Likewise, a highly compressive stress/strain film is known to induce a tensile channel stress/strain. As described below, embodiments of the invention include depositing a uniform stress film over a MOS device and thereafter modulating or adjusting an appropriate stress property of the film in order to achieve a desired channel stress.

Figure 3:
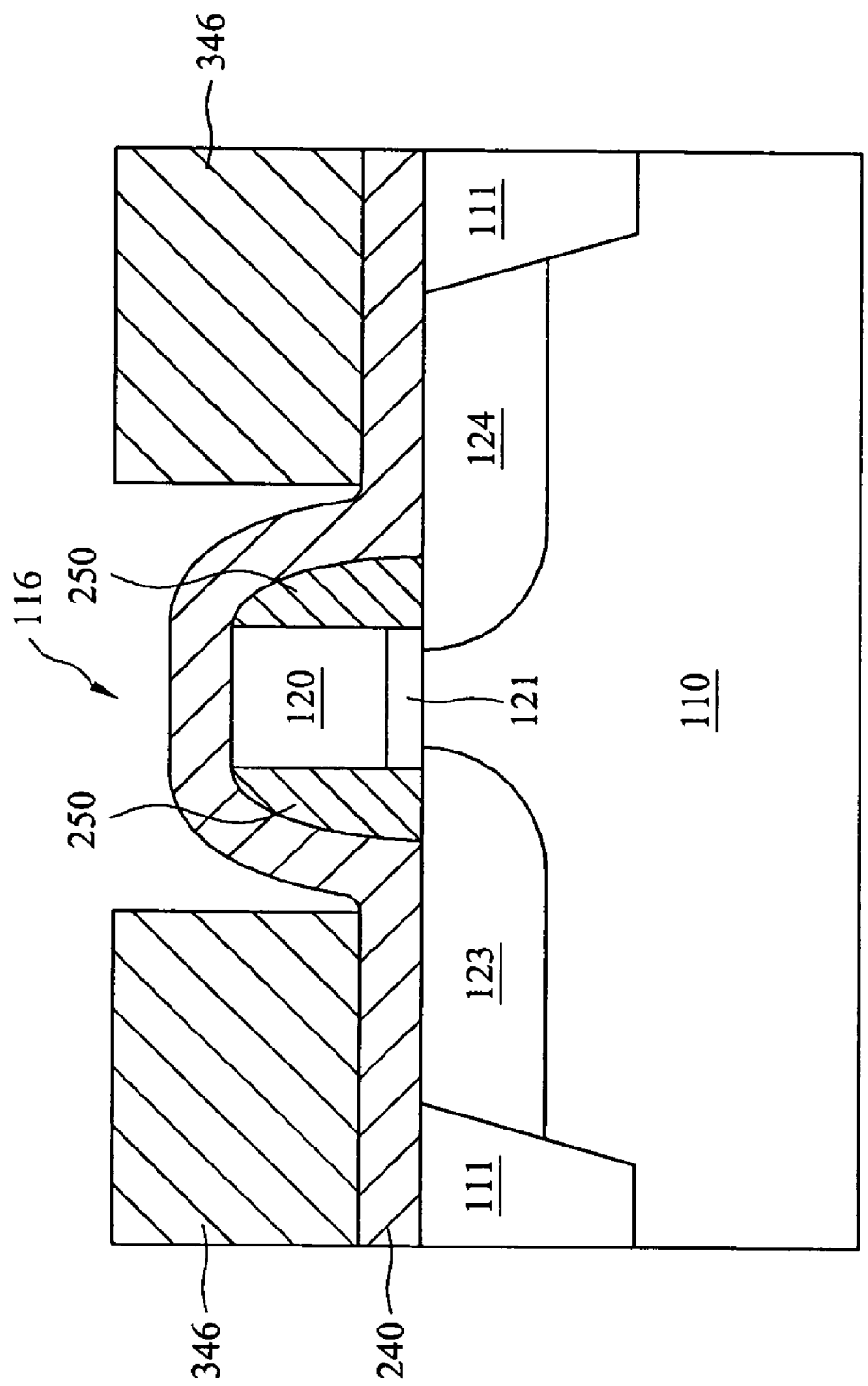
FIG. 3 is a cross-sectional view illustrating a selective treatment of a portion of the stress layer according to embodiments of the invention.

Turning now to FIG. 3, a masking layer 346 is formed at least over a portion of the MOS device 116. Masking layer 346 may include a photoresist or a hardmask. Suitable hardmasks include oxides, nitrides, oxynitrides, or silicon carbide, for example. As illustrated in FIG. 3, masking layer 346 is selectively formed over a portion of the MOS device 116, thereby leaving another portion of the MOS device 116 and the overlying stress layer 240 exposed.

In the embodiment illustrated in FIG. 3, the stress layer 240 is a tensile stress layer and MOS device 116 is an NMOS transistor. In this embodiment, a tensile stress layer over the source 123 and drain 124 regions improves device performance; however, the tensile stress layer over the gate electrode 120 and the sidewall spacers 250 degrades performance. Accordingly, preferred embodiments of the invention provide a method for adjusting a stress property of a portion of the stress layer 240, as illustrated in FIG. 4.

In alternate embodiments, adjusting a stress property may comprise a process such as thermal oxidation, plasma oxidation, ultraviolet (UV) oxidation, steam oxidation, thermal nitriding, plasma nitriding, UV nitriding, steam nitriding, and combinations thereof. In other embodiments, adjusting a stress property may comprise a zone treatment, UV curing, laser anneal, flash anneal, and combinations thereof.

Figure 4:
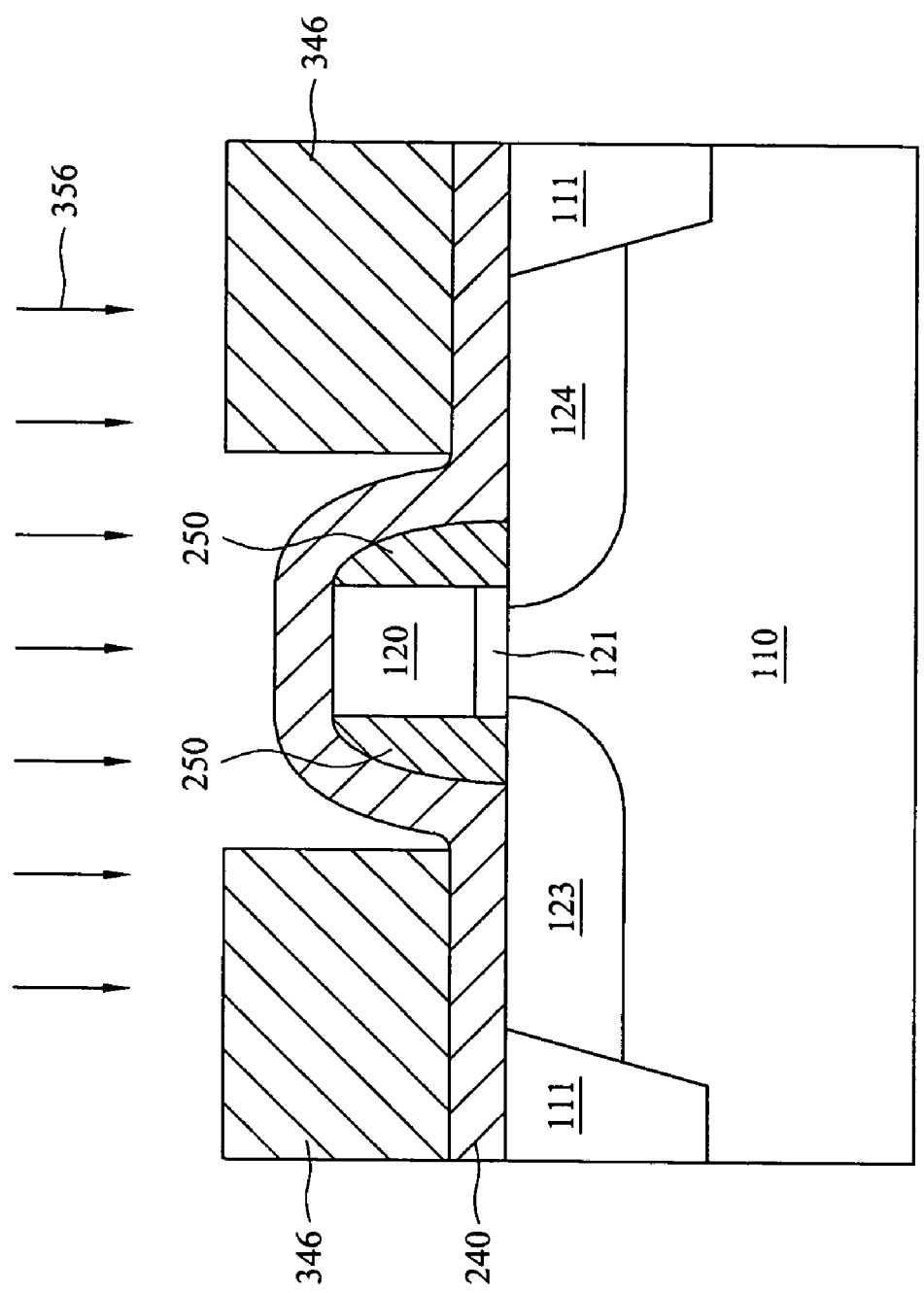
FIG. 4 is a cross-sectional view further illustrating a selective treatment of a portion of the stress layer according to embodiments of the invention.

Turning to FIG. 4, after forming the masking layer 346, preferred embodiments include performing a stress treatment 356 aimed at adjusting the stress/strain distribution in a portion of the stress layer 240. Stress treatments 356 may include local stress relaxation by ion bombardment using, for example, oxygen, nitrogen, carbon, or germanium. Other stress treatments 356 may include stress modulation by changing the stress layer 240 composition using, for example, thermal, plasma, ozone, UV, or steam oxidation. Thermal or plasma nitridation may also be used. Other stress treatment methods 356 may include film densification using, for example, e-beam curing, UV curing, laser treatment (either with or without an absorption or reflection capping layer).

By way of example, Applicants find that an as-deposited silicon nitride layer may have a 0.6 GPa intrinsic stress. Oxygen bombardment may reduce the stress below 0.2 GPa. On the other hand, e-beam curing and UV curing may increase the intrinsic stress to about 0.8 GPa and 1.7 GPa, respectively. Stress layers from about −5.0 to +5.0 GPa, and beyond, are within the scope of embodiments of the invention.

In one embodiment, germanium (Ge) ion implantation is performed to alter the characteristics of a silicon nitride stress layer 240. The ion implantation process may be a conventional beam-line ion implantation process, a plasma immersion ion implantation (PIII), or any other ion implantation process known and used in the art. The dose of the ion implantation maybe in the range of about 1E13 to about 1E16 ions per square centimeter and the energy may be in the range of about 10 eV to about 100 keV.

After the ion implantation process, the properties of the silicon nitride stress layer will be altered such that its intrinsic stress is changed. For example, the stress treatment 356 may continue until a compressive region of the stress layer 240 becomes less compressive. In other embodiments, the stress treatment 356 may continue until a tensile region of the stress layer 240 becomes less tensile. In still other embodiments, the stress treatment 356 may convert the stress layer 240 from one stress type to another, for example, compressive to tensile, or tensile to compressive.

Figure 5:
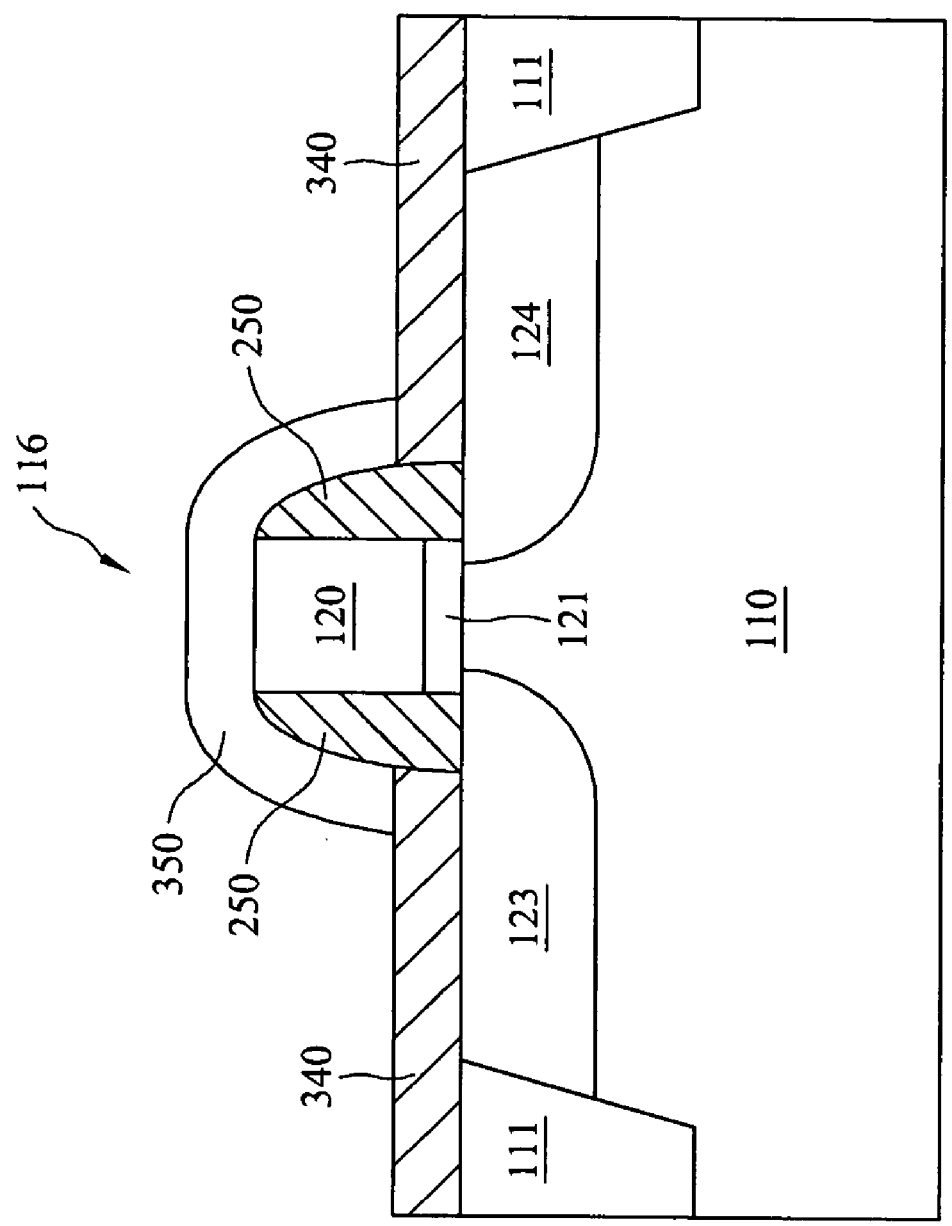
FIG. 5 is a cross-sectional view illustrating a stress layer having a first intrinsic stress region and a second intrinsic stress region according to embodiments of the invention.

Turning now to FIG. 5, after completing the special stress treatment, the resist layer is removed. As shown in FIG. 5, the stress layer is comprised of two regions: a compressive stress region 340 and a stress adjusted region 350. In other embodiments, it may be convenient to refer to the compressive stress region 340 and the stress adjusted region 350 as a first stress layer and a second stress layer, although this is for ease of illustration as the two regions/layers may refer to continuous feature having a uniform appearance. The stress adjusted region 350 of the stress layer may comprise a film that was originally highly compressive and is now less compressive, or highly tensile and is now less tensile. As, in the preferred embodiment of FIG. 5, the stress adjusted region 350 is converted from a compressive layer to a tensile layer.

Generally, preferred embodiments comprise treating a portion of the stress layer so that the portion of the stress layer changes from having a first intrinsic stress to having a second intrinsic stress. Preferably, the first intrinsic stress is one of compressive and tensile, and the second intrinsic stress is the other of compressive and tensile. In other embodiments, the first and second intrinsic stress are of the same type, i.e., both compressive or both tensile. In embodiments wherein both intrinsic stresses are of the same type, the difference is preferably at least a factor of two (100%). In other embodiments, the magnitude of the stress difference is at least about 500 MPa. In alternative embodiments of the invention, a treated stress layer is combined with electrode sidewall spacers that have an intrinsic stress, thereby further enhancing the channel stress.

While other workers describe the beneficial effects of I-shaped and L-shaped spacers, Applicants find that the D-shaped spacers of FIG. 5 are particularly advantageous. For example, in U.S. Pat. No. 6,825,529 to D. Chidambarrao et al., which is hereby incorporated by reference in its entirety, workers describe an L-shaped spacer having an intrinsic tensile stress that induces a tensile stress in a MOSFET channel. Applicants, on the other hand, discovered that the D-shaped spacer of preferred embodiments, produces the contrary result, i.e., a D-shaped spacer having an intrinsic tensile stress induces a compressive stress in the MOSFET channel. Likewise, a D-shaped spacer having an intrinsic compressive stress induces a tensile stress in the MOSFET channel.

In FIG. 5, the sidewall spacers 250 are illustrated as being comprised of a single layer. However, multi-layer spacers are within embodiments of the invention. Alternative embodiments of the invention preferably include spacers having a D-shape or at least a D-shaped part.

An advantage of embodiments of the invention is that the separate stressors are individually combinable for producing a desired target channel stress. For example, an embodiment of an NMOS device comprises a tensile stress layer over the source 123 and drain 124 regions. In other embodiments, the NMOS device comprises a compressive stress layer over the gate electrode 120 and the electrode sidewall spacers 250. In still other embodiments, the electrode sidewall spacers 250 are D-shaped spacers having an intrinsic tensile stress. In these three embodiments, each of the three stressors produces a tensile stress channel, which makes them preferred for an NMOSFET. A particularly preferred embodiment of the invention includes an NMOSFET having a tensile source/drain layer, a compressive layer over the gate electrode and its sidewall, and further includes a tensile D-shaped spacer.

Likewise, a preferred PMOS embodiment includes a compressive stress layer over the source 123 and drain 124 regions, a tensile stress layer over the gate electrode 120 and electrode sidewall spacers 250, wherein the electrode sidewall spacers 250 are D-shaped spacers having an intrinsic compressive stress, and wherein each of the stressors are applied either individually or in combination.

The combinability of embodiments of the invention makes them suitable for CMOS device fabrication, since NMOS and PMOS devices are selectively treated. In embodiments comprising both NMOS and PMOS devices, devices of opposite polarity may be adjacent or located in different regions of the substrate.

Still other embodiments of the invention include transistors and other semiconductor devices formed according embodiments described herein. One embodiment of the invention provides a semiconductor device, such as the intermediate MOS device of FIG. 5. The device comprises a field effect transistor (FET) formed in a substrate, a channel between the source region and the drain region, and a gate electrode over the channel. The device includes a first stress layer over the source and drain regions and a pair of spacers along opposite sidewalls of the gate electrode, such as illustrated in FIG. 5. As further illustrated, a portion of the pair of spacers is within a recess formed between the first stress layer 340 on one side and the gate and the gate electrode 120 on the other side. Another portion of the sidewall spacers 250 is formed between the gate electrode 120 and the second stress layer 350. That is, a pair of spacers is formed along opposite sidewalls of the gate electrode, wherein a first portion of the pair of spacers is within a recess in the first stress layer 340, and a second portion of the pair of spacers is between the second stress layer 350 and the gate electrode 120.

Alternate embodiments comprise a second stress layer over the gate electrode and over a portion of the pair of spacers outside the recess. Preferably, the first stress layer and the second stress layer create a combined stress in the substrate, the combined stress is substantially aligned with the channel region. The combined stress in the substrate may be tensile or compressive. In other embodiments, the pluralities of stress layers may have differing material properties. For example, the first stress layer and the second stress layer differ in a material property such as density, crystallization (e.g., grain boundaries, crystal quality, dislocations, etc.), composition, and combinations thereof.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor fabrication method comprising:
    forming a MOS device on a substrate, the MOS device comprising a source and a drain (a source/drain), a channel region between the source and the drain, and a gate electrode over the channel region;
    forming a stress layer over the MOS device;
    selectively adjusting a stress property of the stress layer over one of the gate electrode and the source/drain from a first stress to a second stress while not adjusting the stress property of the stress layer over the other of the gate electrode and the source/drain.

2. The method of claim 1, further comprising selectively adjusting the stress property of the stress layer over the gate electrode.

3. The method of claim 1, wherein the stress layer comprises a material selected from the group consisting essentially of a silicon-rich nitride, nitrided silicon oxide (SiON), silicon nitride, combinations thereof.

4. The method of claim 1, wherein forming the stress layer comprises a process selected from the group consisting of plasma enhanced chemical vapor deposition (PECVD), low pressure chemical vapor deposition (LPCVD), atomic layer deposition (ALD), rapid thermal chemical vapor deposition (RTCVD), physical vapor deposition (PVD), and combinations thereof.

5. The method of claim 1, wherein the first stress is tensile and the second stress is compressive.

6. The method of claim 1, wherein the first stress is compressive and the second stress is tensile.

7. The method of claim 1, wherein adjusting the stress property comprises implanting a material selected from the group consisting essentially of germanium, xenon, silicon, argon, and combinations thereof.

8. The method of claim 1, wherein adjusting the stress property comprises a process selected from the group consisting essentially of a zone treatment, UV curing, laser anneal, flash anneal, thermal oxidation, plasma oxidation, ultraviolet (UV) oxidation, steam oxidation, thermal nitriding, plasma nitriding, UV nitriding, steam nitriding, and combinations thereof.

9. A semiconductor fabrication method comprising:
    forming a gate electrode having a pair of sidewall spacers over a substrate;
    forming a stress layer over the gate electrode, the sidewall spacers, and the substrate; and
    adjusting a stress property of the stress layer over the gate electrode and over the sidewall spacers form a first stress to a second stress, wherein the first stress is one of tensile and compressive, and the second stress is the other of tensile and compressive.

10. The method of claim 9, wherein the substrate comprises a material selected from the group consisting essentially of silicon, silicon germanium, and combinations thereof.

11. The method of claim 9, wherein the stress layer comprises a material selected from the group consisting essentially of a silicon-rich nitride, nitrided silicon oxide (SiON), silicon nitride, and combinations thereof.

12. The method of claim 9, wherein the first stress is compressive and the second stress is tensile.

13. The method of claim 9, wherein adjusting the stress property comprises implanting a material selected from the group consisting essentially of germanium, xenon, and combinations thereof.

14. The method of claim 9, wherein adjusting the stress property comprises a process selected from the group consisting essentially of a zone treatment, UV curing, laser anneal, flash anneal, thermal oxidation, plasma oxidation, ultraviolet (UV) oxidation, steam oxidation, thermal nitriding, plasma nitriding, UV nitriding, steam nitriding, and combinations thereof.

* * * * *

UNITED STATES PATENT AND TRADEMARK OFFICE
CERTIFICATE OF CORRECTION

| | |
|---|---|
| PATENT NO. | : 7,232,730 B2 |
| APPLICATION NO. | : 11/119522 |
| DATED | : June 19, 2007 |
| INVENTOR(S) | : Chen et al. |

It is certified that error appears in the above-identified patent and that said Letters Patent is hereby corrected as shown below:

Column 10, line 12; delete "form" insert --from--

Signed and Sealed this

Fourteenth Day of August, 2007

JON W. DUDAS
*Director of the United States Patent and Trademark Office*